(12) United States Patent
Warnick et al.

(10) Patent No.: US 9,112,270 B2
(45) Date of Patent: Aug. 18, 2015

(54) PLANAR ARRAY FEED FOR SATELLITE COMMUNICATIONS

(75) Inventors: Karl F. Warnick, Spanish Fork, UT (US); Zhenchao Yang, Provo, UT (US)

(73) Assignee: Brigham Young Univeristy, Provo, UT (US)

( * ) Notice: Subject to any disclaimer, the term of this patent is extended or adjusted under 35 U.S.C. 154(b) by 308 days.

(21) Appl. No.: 13/488,199

(22) Filed: Jun. 4, 2012

(65) Prior Publication Data

US 2012/0306698 A1 Dec. 6, 2012

Related U.S. Application Data

(60) Provisional application No. 61/519,984, filed on Jun. 2, 2011, provisional application No. 61/546,582, filed on Oct. 13, 2011.

(51) Int. Cl.
*H01Q 5/00* (2006.01)
*H01Q 1/48* (2006.01)
(Continued)

(52) U.S. Cl.
CPC ............ *H01Q 5/35* (2015.01); *H01Q 9/0407* (2013.01); *H01Q 19/17* (2013.01); *H01Q 21/065* (2013.01); *H01Q 21/24* (2013.01); *Y10T 29/49016* (2015.01)

(58) Field of Classification Search
CPC . H01Q 5/0048; H01Q 9/0435; H01Q 21/065; H01Q 9/0457; H01Q 9/0428; H01Q 5/40
USPC .......................................................... 343/846
IPC ................................ H01Q 9/0457, 9/0428, 5/40
See application file for complete search history.

(56) References Cited

U.S. PATENT DOCUMENTS 4,291,312 A * 9/1981 Kaloi ..................... 343/700 MS
4,755,821 A 7/1988 Itoh et al.
(Continued)

FOREIGN PATENT DOCUMENTS

EP 0720252 A1 7/1996
EP 0805508 A2 11/1997
(Continued)

OTHER PUBLICATIONS

Balanis (Antenna Theory: Analysis Design, 3rd Ed.; 2005; Ch. 6 pp. 283-284).*
(Continued)

*Primary Examiner* — Dameon E Levi
*Assistant Examiner* — Ricardo Magallanes
(74) *Attorney, Agent, or Firm* — Kunzler Law Group

(57) ABSTRACT

An apparatus, system, and method are disclosed for wireless communications. A planar antenna element is disposed on a surface of a substrate. The planar antenna element comprises an electrically conductive material. The substrate comprises a dielectric material. The planar antenna element may be arranged in a planar antenna array as a feed for a reflector antenna or as an aperture array. The planar antenna element may comprise a slot patch antenna element with a slot in the electrically conductive material of the planar antenna element circumscribing the planar antenna element. The slot exposes the dielectric material of the substrate. A ground plane may be disposed on the surface of the substrate. The ground plane comprises an electrically conductive material. The slot may be disposed between the ground plane and the patch antenna element. The substrate may include electronic components for beam steering, upconversion, downconversion, amplification, or other functions.

22 Claims, 7 Drawing Sheets

(51) Int. Cl.
*H01Q 21/00* (2006.01)
*H01Q 9/38* (2006.01)
*H01Q 5/35* (2015.01)
*H01Q 9/04* (2006.01)
*H01Q 19/17* (2006.01)
*H01Q 21/06* (2006.01)
*H01Q 21/24* (2006.01)

(56) References Cited

U.S. PATENT DOCUMENTS

| | | | |
|---|---|---|---|
| 4,873,529 | A | 10/1989 | Gibson |
| 4,893,126 | A * | 1/1990 | Evans .......................... 342/175 |
| 5,451,969 | A | 9/1995 | Toth et al. |
| 5,467,100 | A | 11/1995 | Chen |
| 5,581,266 | A | 12/1996 | Peng et al. |
| 5,969,681 | A * | 10/1999 | O'Neill, Jr. ............ 343/700 MS |
| 6,191,740 | B1 | 2/2001 | Kates et al. |
| 6,198,437 | B1 | 3/2001 | Watson et al. |
| 6,208,316 | B1 | 3/2001 | Cahill |
| 6,297,774 | B1 | 10/2001 | Chung |
| 6,445,346 | B2 | 9/2002 | Fathy et al. |
| 7,042,402 | B2 | 5/2006 | Modro |
| 7,342,471 | B2 | 3/2008 | McKinzie, III |
| 7,397,430 | B2 * | 7/2008 | Harihara ................ 343/700 MS |
| 7,427,930 | B2 | 9/2008 | Arnold et al. |
| 7,636,064 | B2 | 12/2009 | Shi |
| 7,808,439 | B2 | 10/2010 | Yang et al. |
| 7,864,118 | B2 | 1/2011 | Shi |
| 2004/0008147 | A1 | 1/2004 | Killen et al. |
| 2006/0109175 | A1 | 5/2006 | Yeh |
| 2008/0129634 | A1 * | 6/2008 | Pera et al. ..................... 343/853 |
| 2010/0164783 | A1 * | 7/2010 | Choudhury et al. .......... 342/175 |
| 2011/0199279 | A1 * | 8/2011 | Shen et al. .................... 343/857 |
| 2011/0242863 | A1 * | 10/2011 | Park et al. ..................... 363/126 |

FOREIGN PATENT DOCUMENTS

| | | |
|---|---|---|
| WO | 2007060148 A1 | 5/2007 |
| WO | 2009150609 A1 | 12/2009 |

OTHER PUBLICATIONS

Angus C. K. Mak, Corbett R. Rowell, and Ross D. Murch, "Isolation Enhancement Between Two Closely Packed Antennas", IEEE Transactions on Antennas and Propagation, vol. 56, No. 11, Nov. 2008.
Hang Wong, Ka-Leung Lau, and Kwai-Man Luk, "Design of Dual-Polarized L-Probe Patch Antenna Arrays With High Isolation", IEEE Transactions on Antennas and Propagation, vol. 52, No. 1, Jan. 2004.
PCT/US2012/040810, International Search Report and Written Opinion, Nov. 22, 2012.

* cited by examiner

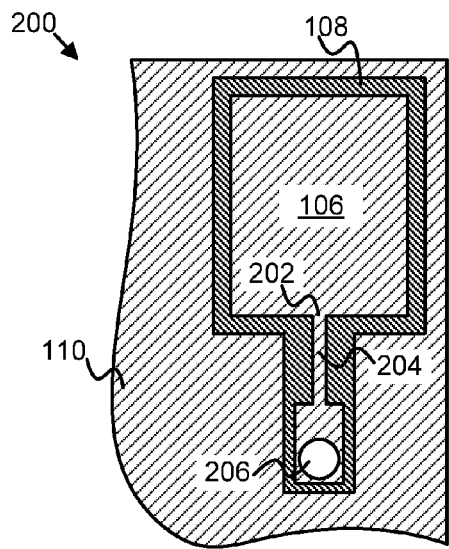
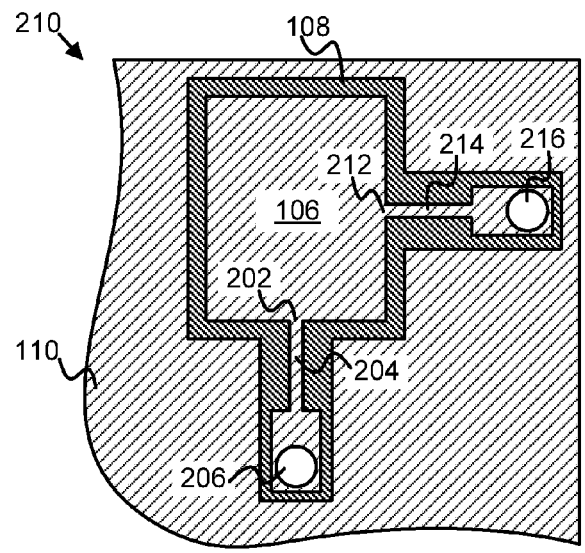
FIG. 2A   FIG. 2B
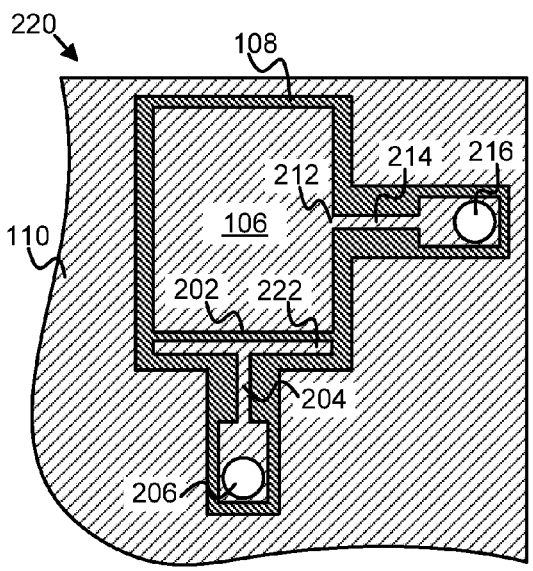
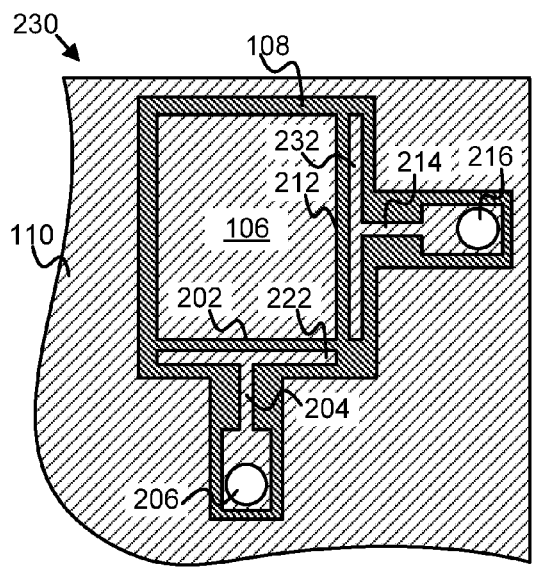
FIG. 2C   FIG. 2D

PLANAR ARRAY FEED FOR SATELLITE COMMUNICATIONS

CROSS-REFERENCES TO RELATED APPLICATIONS

This application claims priority to U.S. Provisional Patent Application No. 61/519,984 entitled "LOW COST, HIGH EFFICIENCY PASSIVE ARRAY ANTENNA" filed on Jun. 2, 2011, for Karl F. Warnick et al., and to U.S. Provisional Patent Application No. 61/546,582 entitled "APPARATUS, SYSTEM, AND METHOD FOR A PLANNAR SLOT PATCH ANTENNA" filed on Oct. 13, 2011, for Karl F. Warnick et al., each of which are incorporated herein by reference.

FIELD

This invention relates to wireless communications and more particularly relates to antennas for satellite communications.

BACKGROUND

Antenna efficiency is especially important for satellite communications, where signals from distant satellite transponders can be weak. The more noise a satellite antenna introduces to a signal, the larger the dish antenna that should be used with the antenna. Further, in communications systems that both transmit and receive, interference from the transmit signal may reduce the sensitivity of the communications system to the receive signal or may burn out components of the system such as low noise amplifiers.

To reduce noise and to provide isolation between signals, satellite communications systems typically use a horn-type feed antenna with an orthomode transducer ("OMT"). While horn-type feed antennas and OMTs can provide satisfactory performance, specialized OMTs increase the complexity and cost of the feed system. Antennas for satellite communications are also typically fixed, and the antenna beam must be physically adjusted by moving the antenna structure to compensate for errors in positioning. Moreover, horn-type feeds are machined parts that must be attached to a printed circuit board containing other common functions in satellite communications systems, causing the size of the system to be large in size and costly to manufacture.

SUMMARY

From the foregoing discussion, it should be apparent that a need exists for an apparatus, system, and method for efficient wireless communications. Beneficially, such an apparatus, system, and method would provide high isolation and efficiency at a lower cost and/or complexity than a horn-type feed antenna with an OMT in a planar feed antenna that may be directly integrated on the same printed circuit board used for other common functions such as low noise amplifiers, block downconverters, and block upconverters, leading to significant reductions in size and assembly cost.

The present invention has been developed in response to the present state of the art, and in particular, in response to the problems and needs in the art that have not yet been fully solved by currently available wireless communications antennas. Accordingly, the present invention has been developed to provide an apparatus, system, and method for wireless communications that overcome many or all of the above-discussed shortcomings in the art.

The apparatus for wireless communications is provided with a plurality of elements for wireless communications. These elements in the described embodiments include a planar patch antenna element, a slot, a ground plane, a receive feed point, a transmit feed point, a capacitive coupling, one or more additional patch antenna elements, a feed point input/output ("I/O") port, feed lines, electrically conductive vias, and an opposite ground plane.

In one embodiment, the planar patch antenna element is disposed on a surface of a substrate. The planar patch antenna element includes an electrically conductive material and the substrate includes a dielectric material. A receive feed point of the patch antenna element, in one embodiment, is tuned to a first frequency. In another embodiment, a transmit feed point of the patch antenna element is tuned to a second frequency, so that the patch antenna element is configured to transmit and receive at different frequencies. The slot, in certain embodiments, is in the electrically conductive material of the patch antenna element. In one embodiment, the slot circumscribes the patch antenna element. The slot may expose dielectric material of the substrate. In one embodiment, the ground plane is disposed on the surface of the substrate. The ground plane includes an electrically conductive material. In certain embodiments, the slot is disposed between the ground plane and the patch antenna element.

In one embodiment, the receive feed point for the patch antenna element conducts communications signals away from the patch antenna element. In a further embodiment, the transmit feed point for the patch antenna element conducts communications signals to the patch antenna element. The transmit feed point, in certain embodiments, is disposed on an orthogonal side of the patch antenna element to a side of the patch antenna element on which the receive feed point is disposed, so that the transmit feed point and the receive feed point excite radiation patterns with orthogonal polarization relative to each other.

In one embodiment, the capacitive coupling is between the patch antenna element and the receive point and/or the transmit feed point. The capacitive coupling, in certain embodiments, provides electrical isolation between the receive feed point and the transmit feed point. In one embodiment, the capacitive coupling includes an elongate conductor disposed parallel to a side of the patch antenna element. The slot, in a further embodiment, extends between the elongate conductor and the side of the patch antenna so that exposed dielectric material of the substrate separates the elongate conductor from the side of the patch antenna element.

In one embodiment, the one or more additional patch antenna elements and the patch antenna elements form a plurality of patch antenna elements arranged in an antenna array. A feed point I/O port for the patch antenna elements, in one embodiment, is offset toward a first subset of the patch antenna elements and away from a second subset of the patch antenna elements. Feed points corresponding to the feed point I/O port, in certain embodiments, are disposed on one side of the first subset of the patch antenna elements and on an opposing side of the second subset of the patch antenna elements. The feed point I/O port, in various embodiments, may include a receive feed point output port and/or a transmit feed point input port. The offset for the feed point I/O port, in a further embodiment, is about a one quarter wavelength offset so that a half wavelength path difference exists between the first subset of the patch antenna elements and the second subset of the patch antenna elements.

In one embodiment, the antenna array is a prime focus feed for a reflector antenna. The antenna array, in a further embodiment, is configured to illuminate the reflector antenna from a location at a primary focus of the reflector antenna. In other embodiments, the antenna array may be an aperture array that is configured for wireless communications without a reflector antenna.

In one embodiment, feed lines for the receive feed point and/or the transmit feed point are disposed on the surface of the substrate. The feed lines, in a further embodiment, are in communication with the patch antenna element. The slot, in one embodiment, circumscribes the feed lines on the surface of the substrate. In certain embodiments, feed lines for one of the receive feed point and the transmit feed point for each patch antenna element are disposed toward a perimeter of the patch antenna elements and feed lines for the other of the receive feed point and the transmit feed point for each patch antenna element are disposed toward an interior of the patch antenna elements.

In one embodiment, the electrically conductive vias are disposed in the ground plane, extending between the ground plane and an opposite ground plane. The opposite ground plane is disposed on an opposite side of the substrate from the ground plane. In certain embodiments, the electrically conductive vias are arranged around a perimeter of the patch antenna element. Dimensions of the patch antenna element and the slot, in one embodiment, are selected so that the patch antenna element and the slot have a radiation efficiency of at least ninety percent. In certain embodiments, several patch antenna elements may be arranged in an array of several elements, such as a two by two array of four elements, and the array may have a radiation pattern that illuminates a reflector type antenna with high aperture efficiency and high spillover efficiency.

A system of the present invention is also presented for wireless communications. The system may be embodied by a planar antenna array that includes a substrate and a plurality of planar antenna elements. In particular, the system, in certain embodiments, may include a reflector antenna, one or more slots, a ground plane, an opposite ground plane, one or more routing layers, one or more variable gain amplifiers, and/or one or more phase shifters.

In one embodiment, the planar antenna array is a prime focus feed for a reflector antenna. The planar antenna array, in a further embodiment, is configured to illuminate the reflector antenna from a location at a primary focus of the reflector antenna. The substrate, in one embodiment, includes a dielectric material. The planar antenna elements, in a further embodiment, are disposed on a surface of the substrate. The planar antenna elements, in one embodiment, include an electrically conductive material. In another embodiment, the substrate includes additional dielectric and/or conductive layers with one or more electronic circuits such as low noise amplifiers, block downconverters, block upconverters, power amplifiers, and other supporting satellite communications feed system electronics.

In one embodiment, the reflector antenna is disposed opposite the planar antenna elements and the surface of the substrate. The planar antenna elements, in a further embodiment, produce a radiation pattern that is matched to a focal length of the reflector antenna divided by a diameter of the reflector antenna. In other embodiments, the planar antenna elements may be arranged as an aperture antenna array without use of a reflector antenna. In one embodiment, the reflector antenna and the planar antenna are arranged in an axis symmetric geometry. In another embodiment, the reflector antenna and the planar antenna are arranged in an offset reflector geometry.

In certain embodiments, one or more slots are in the electrically conductive material of the plurality of planar antenna elements, exposing the dielectric material of the substrate. The one or more slots, in a further embodiment, circumscribe each planar antenna element. In one embodiment, a ground plane is disposed on the surface of the substrate. The ground plane, in a further embodiment, includes an electrically conductive material. The one or more slots, in certain embodiments, are disposed between the ground plane and the patch antenna elements.

In certain embodiments, one or more feed lines are disposed on the surface of the substrate. The one or more feed lines, in one embodiment, are in communication with the planar antenna elements. In a further embodiment, the one or more slots circumscribe the one or more feed lines on the surface of the substrate.

In another embodiment, the planar antenna array includes a plurality of electrically conductive vias disposed in the ground plane. The electrically conductive vias, in one embodiment, extend between the ground plane and an opposite ground plane that is disposed on an opposite side of the substrate from the ground plane. In another embodiment, the plurality of electrically conductive vias are arranged around a perimeter of each of the plurality of planar antenna elements.

One or more routing layers, in certain embodiments, are disposed on an opposite side of the substrate from the planar antenna elements. The one or more routing layers, in a further embodiment, conduct electrical signals between the planar antenna elements and one or more electrical devices. The one or more electrical devices, in one embodiment, include one or more variable gain amplifiers and/or one or more phase shifters. In one embodiment, the variable gain amplifiers adjust an amplitude of communications signals for the planar antenna elements. The one or more phase shifters, in a further embodiment, adjust a phase of the communications signals for the planar antenna elements. The one or more variable gain amplifiers and/or the one or more phase shifters, in certain embodiments, electronically steer a communications beam for the planar antenna elements. In another embodiment, the one or more electrical devices may include one or more of a low noise amplifier, a block upconverter, a block downconverter, and/or a power amplifier.

In one embodiment, the plurality of planar antenna elements may include one or more of a slot-type antenna element, a patch-type antenna element, a slot patch antenna element, and/or a dielectric resonator antenna element. In a further embodiment, the dimensions of the plurality of planar antenna elements are selected such that the planar antenna elements have a radiation efficiency of at least ninety percent. In another embodiment, the planar antenna array has a radiation pattern that illuminates a reflector type antenna with high aperture efficiency and high spillover efficiency.

A method of the present invention is also presented for forming an antenna for wireless communications. In one embodiment, the method includes forming a planar patch antenna element disposed on a surface of a substrate. The planar patch antenna element, in certain embodiments, includes an electrically conductive material. The substrate, in a further embodiment, includes a dielectric material. In a further embodiment, a receive feed point of the patch antenna is tuned to a first frequency. A transmit feed point of the patch antenna element, in another embodiment, is tuned to a second frequency so that the patch antenna element is configured to transmit and receive at different frequencies. The method, in another embodiment, includes forming a slot in the electrically conductive material of the patch antenna element. The slot, in one embodiment, circumscribes the patch antenna element. In certain embodiments, the slot exposes the dielectric material of the substrate.

In one embodiment, the method includes forming a ground plane disposed on the surface of the substrate. The ground plane, in a further embodiment, includes an electrically conductive material. In certain embodiments, the slot is disposed between the ground plane and the patch antenna element. The method, in one embodiment, includes forming a capacitive coupling between the patch antenna element and a feed point for the patch antenna element, such as a receive feed point and/or a transmit feed point.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. Similarly, the embodiments described above with regard to the disclosed apparatus, system, and method may be combined in any suitable manner in the apparatus, the system, or the method to form various embodiments.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 2A is a schematic block diagram illustrating a first embodiment of a slot patch antenna in accordance with the present invention;

FIG. 2B is a schematic block diagram illustrating a second embodiment of a slot patch antenna in accordance with the present invention;

FIG. 2C is a schematic block diagram illustrating a third embodiment of a slot patch antenna in accordance with the present invention;

FIG. 2D is a schematic block diagram illustrating a fourth embodiment of a slot patch antenna in accordance with the present invention;

DETAILED DESCRIPTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 1A:
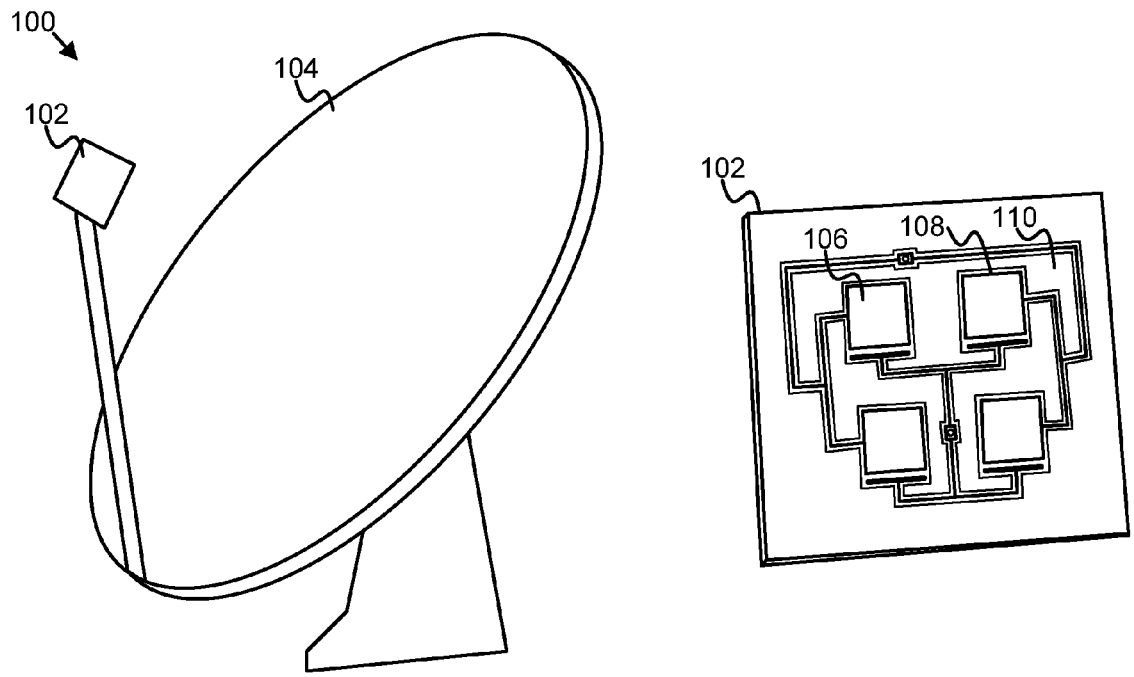
FIG. 1A is a perspective view illustrating one embodiment of a system for wireless communications in accordance with the present invention.

FIG. 1A depicts one embodiment of a system 100 for wireless communications. The system 100, in the depicted embodiment, includes a planar antenna array 102 and a reflector antenna 104. The planar antenna array 102 includes several planar patch antenna elements 106 that are surrounded by one or more slots 108 and a ground plane 110.

In the depicted embodiment, each planar patch antenna element 106 and the surrounding one or more slots 108 form what is referred to herein as a slot patch antenna element. In other embodiments, the planar antenna array 102 may include one or more slot-type antenna elements, patch-type antenna elements, slot patch antenna elements, dielectric resonator antenna ("DRA") elements, and/or other types of planar antenna elements. For example, the planar antenna array 102 may include one or more modified patch antenna elements, stacked patch antenna elements, circular patch antenna elements with one or more slots, modified circular patch antenna elements, rectangular patch antenna elements, square patch antenna elements, and/or other patch-type antenna elements. Planar antenna elements of the planar antenna array 102 may have a linear polarization, a circular polarization, or the like based on the geometry of the planar antenna elements. One of skill in the art, in light of this disclosure, will recognize various types and geometries of planar antenna elements which may be substituted for the depicted slot patch antenna elements in the planar antenna array 102.

In embodiments where the planar antenna array 102 includes the depicted slot patch antenna elements, by combining a patch antenna element 106 and a slot-type antenna element 108, the planar antenna array 102 may provide high efficiency and high isolation on a planar substrate such as a printed circuit board ("PCB") that may be manufactured in high volumes at low costs, without the bulk, complexity, and cost of a machined metal horn-type feed antenna and an orthomode transponder ("OMT"). Manufacturing a planar antenna array 102 on a planar substrate also allows for easy integration of supporting circuits such as low noise amplifier, block upconverter, block downconverter, and/or power amplifier on the same substrate, adjacent to the planar antenna array 102 and/or on the backside of the substrate. For example, in one embodiment, the planar antenna array 102 may have an efficiency of about ninety percent or more, and produce a radiation pattern that illuminates a reflector antenna 104 with aperture efficiency of seventy to eighty percent or more and spillover efficiency of ninety percent or more.

The planar antenna array 102, in certain embodiments, provides a good impedance match, high isolation between transmit and receive ports, low signal loss, high radiation efficiency, high spillover efficiency, and/or high aperture efficiency when illuminating a reflector antenna 104. The combination of a patch antenna element 106 with a surrounding slot 108, in one embodiment, optimizes the current distribution on the electrically conductive surface of the planar antenna array 102 and optimizes the fields in the dielectric of the substrate to achieve a higher radiation efficiency than either a patch antenna or slot antenna alone, making the planar antenna array 102 suitable for satellite communications. In other embodiments, the planar antenna array 102 may be used for terrestrial communications.

In the depicted embodiment, the planar antenna array 102 is a passive array feed antenna that may be used as a plug-in replacement for a horn-type feed antenna and OMT used with a reflector antenna 104, such as the depicted parabolic dish reflector antenna 104 or the like. In other embodiments, the planar antenna array 102 may include an active array feed antenna, with variable gain amplifiers, phase shifters, low noise amplifiers, block downconverters, block upconverters, power amplifiers, and/or other electrical devices to electronically steer the antenna beam. Electrical devices for the planar antenna array 102, such as integrated circuit devices or discrete electrical components, may be onboard or otherwise integrated with the same substrate assembly as the patch antenna elements 106, on an opposite side of the substrate, toward a perimeter of the substrate, or the like. Electronically steering the antenna beam for the planar antenna array 102 allows the planar antenna array 102 to adjust or compensate for improper installation, movement due to wind, or other sources of misalignment without physically moving or realigning the planar antenna array 102.

In embodiments where the planar antenna array 102 comprises a feed (receive and/or transmit) for a reflector antenna 104, the planar antenna array 102 may be a prime focus feed that efficiently illuminates the reflector antenna 104 from a location at a primary focus of the reflector antenna 104, without a secondary reflector or the like. A prime focus feed antenna array 102, as opposed to a Cassegrain or Gregorian feed, does not include a secondary reflector, but is located in front of the reflector antenna 104 at or near a primary focus of the reflector antenna 104. As described above, in certain embodiments, electronic beam steering may compensate for certain misalignment of the planar antenna array 102.

A prime focus feed antenna array 102, in one embodiment, may have an axis symmetric reflector geometry, where the prime focus feed antenna array 102 is located at a center axis of the reflector antenna 104. In another embodiment, a prime focus feed antenna array 102 may have an offset reflector geometry, where the reflector antenna 104 may be formed as an asymmetrical segment of a paraboloid, so that the primary focus of the reflector antenna 104 is offset from the center axis of the reflector antenna 104 so that the prime focus feed antenna array 102 is located at an offset toward one side of the reflector antenna 104 instead of at the center. In an offset reflector geometry, in certain embodiments, the prime focus feed antenna array 102 may be located outside of a path of communications signals, so that the communications signals reach the reflector antenna 104 without the prime focus feed antenna array 102 blocking the communications signals.

Figure 1B:
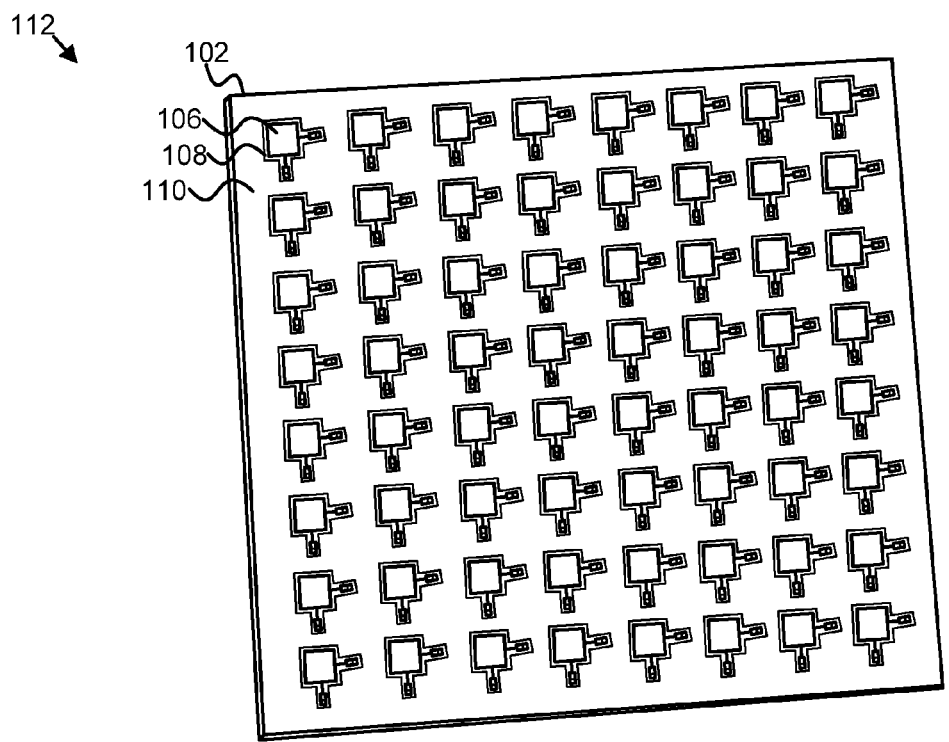
FIG. 1B is a perspective view illustrating another embodiment of a system for wireless communications in accordance with the present invention.

In the depicted embodiment, the planar antenna array 102 includes a four element orthogonal polarized dual band planar passive slot patch antenna array feed. In other embodiments, the system 100 may include a single slot patch element, may include two slot patch elements, may include more than the depicted four slot patch elements, may include other types or geometries of antenna elements, or the like. For example, an eight by eight aperture phased planar antenna array 102 is depicted in FIG. 1B and described in greater detail below, and other embodiments of an aperture planar antenna array 102 may include hundreds or thousands of planar antenna elements.

In various embodiments, the planar antenna array 102 may be configured to receive and/or transmit in the Ku band, the Ka band, the C band, or in another frequency band. One of skill in the art, in light of this disclosure, will recognize dimensions and other design aspects that may be adjusted to configure the planar antenna array 102 for use with various communication frequencies. Similarly, while the patch antenna elements 106 of the planar antenna array 102, in the depicted embodiment, each have a linear polarization, in other embodiments, the patch antenna elements 106 may have a circular polarization, or the like.

The patch antenna elements 106 are formed in an electrically conductive layer disposed on a surface of a dielectric substrate of the planar antenna array 102. The patch antenna elements 106 may be formed of copper foil, electroplated copper, and/or of one or more other electrically conductive materials. Dielectric material of the substrate, in various embodiments, may include epoxy, fabric, glass, paper, polymer, ceramic, and/or other electrically insulating materials. For example, in one embodiment, the substrate for the planar antenna array 102 may be a radio frequency ("RF") or microwave class PCB or the like, or a combination of layers with several types of substrates, selected based on cost and/or performance for the antenna elements 102, interconnects, or electronic components that occupy the layer.

In the depicted embodiment, the patch antenna elements 106 have rectangular, non-square shapes, allowing receive feed points and transmit feed points for the patch antenna elements 106 to receive and transmit at different frequencies due to the different lengths from orthogonal sides of the patch antenna element 106, providing dual band operation between transmitting and receiving. In other embodiments, the patch antenna elements 106 may have square shapes, circular shapes, elliptical shapes, or other shapes to achieve other communications characteristics. Because the feed points, in the depicted embodiment, are on orthogonal sides of the patch antenna elements 106, the feed points excite the patch antenna elements 106 in orthogonal transverse modes ("TM"), TM10 and TM01. While the feed points are generally referred to herein as a receive feed point and a transmit feed point, in other embodiments, the described feed points may comprise two receive feed points, two transmit feed points, or the like. For example, due to the different lengths of orthogonal sides of the patch antenna element 106, in one embodiment, the patch antenna element 106 may simultaneously receive communications signals at two different frequencies, with two orthogonal receive feed points, or the like. In another embodiment, for example, the patch antenna element 106 may simultaneously transmit communications signals at two different frequencies, with two orthogonal transmit feed points, or the like.

Feed points for the patch antenna elements 106, in the depicted embodiment, are disposed at or near a middle point of a side of the patch antenna element 106, to prevent unwanted modes from being excited and to improve signal isolation. One feed point for each patch antenna element 106, in the depicted embodiment, includes a capacitive coupling that provides further isolation between feed points. Capacitive couplings are described in greater detail with regard to FIGS. 2C and 2D.

The patch antenna elements 106, in the depicted embodiment, each have a receive feed point and a transmit feed point and one feed network tying the receive feed points together and another feed network tying the transmit feed points together, both in a passive configuration. In the depicted embodiment, the feed networks are isolated, with one set of feed lines located toward the perimeter of the patch antenna elements 106 and the other set of feed lines located toward the interior of the patch antenna elements 106. One set of feed lines, in the depicted embodiment, includes an offset feed point so that the signal input to one of the feed networks cancels in the other feed network, further isolating the two bands for the patch antenna elements 106.

In the depicted embodiment, the one or more slots 108 separate the electrically conductive material of the patch antenna elements 106 from electrically conductive material of the ground plane 110. The one or more slots 108, in one embodiment, include grooves or openings in the electrically conductive material of the patch antenna elements 106 to expose the dielectric material of the substrate. The one or more slots 108 may be filled with ambient air or with another dielectric material over the exposed dielectric material of the substrate. The one or more slots 108, in the depicted embodiment, circumscribe the patch antenna elements 106 so that no direct current ("DC") electrical connection or short circuit exists between the patch antenna elements 106 and the ground plane 110.

A slot 108 around a patch antenna element 106, in one embodiment, acts as a slot-type antenna element for receiving and/or transmitting signals. In a further embodiment, a slot 108 around a patch antenna element 106 moves or pulls at least a portion of an electrical field out from the dielectric of the substrate, to reduce noise and increase the efficiency of the planar antenna array 102. In certain embodiments, the one or more slots 108 may also circumscribe feed lines for the patch antenna elements 106, creating a grounded coplanar waveguide ("GCPW") for the feed lines. A GCPW transmission line typically has a small size, low stray radiation, and good shielding properties.

In one embodiment, the ground plane 110 is an electrically conductive layer disposed on the same surface of the substrate as the patch antenna elements 106. The ground plane 110 may be formed from the same electrically conductive material as the patch antenna elements 106. For example, the ground plane 110 may include copper foil, electroplated copper, and/or of one or more other electrically conductive materials. In the depicted embodiment, the one or more slots 108 are between the ground plane 110 and the patch antenna elements 106, separating and/or isolating the patch antenna elements 106 from the ground plane 110. In certain embodiments, due to the slot 108, feed lines, and the like, the ground plane 110 may be broken into several distinct segments. The perimeter wall of a patch antenna element 106 may form an inner wall of a slot 108 and the interior wall of the ground plane 110 may form an outer wall of a slot 108.

In certain embodiments, the ground plane 110 reduces or eliminates surface waves on the surface of the substrate. Surface waves degrade antenna performance and increase undesirable backlobe levels. In a further embodiment, described in greater detail below with regard to the vias 304 of FIGS. 3A, 3B, 4, and 5, the ground plane 110 includes electrically conductive vias through the substrate, extending between the ground plane 110 and an opposite ground plane. The electrically conductive vias, in one embodiment, are arranged around a perimeter of the patch antenna elements 106. The electrically conductive vias, in various embodiments, may reduce or eliminate surface waves, may suppress cavity modes in the substrate, and the like.

The opposite ground plane, in one embodiment, is disposed on an opposite side of the substrate from the ground plane 110. The ground plane 110 may be described as a top or front ground plane, and the opposite ground plane may be described as a bottom or back ground plane. The opposite ground plane, described below with regard to the opposite ground plane 306 of FIGS. 3A and 3B, blocks and/or reduces radiation directed behind the patch antenna elements 106, increasing the efficiency of the patch antenna elements 106. In one embodiment, the opposite ground plane has a footprint or surface area as large as or larger than a footprint or surface area of the patch antenna elements 106.

In the depicted embodiment, because signals to and from the patch antenna elements 106 are not manipulated for beam steering purposes, but are instead combined in a passive array, the patch antenna elements 106, the one or more slots 108, the ground plane 110, the feed lines, and the feed point input/output ("I/O") ports are each disposed on a single surface of the substrate of the planar antenna array 102 and within the same plane, with the opposite ground plane on the opposite side of the substrate. This three layer configuration of the planar antenna array 102, with a dielectric substrate layer between two conductive layers, in certain embodiments, has low manufacturing costs, low material costs, a reduced size when compared to a traditional horn-type feed antenna and an OMT, or to other types of antennas.

In one embodiment, even for a passive planar antenna array 102, one or more electrical devices such as a low noise amplifier, a block downconverter, a power amplifier, a block upconverter, or the like are in communication with the patch antenna elements 106 to process signals for the patch antenna elements 106. The one or more electrical devices may be disposed on the same substrate with the patch antenna elements 106 (on the same surface or an opposite surface), may be in communication with the patch antenna elements 106 through one or more routing layers, or may otherwise be in communication with the patch antenna elements 106.

The reflector antenna 104 is disposed opposite the patch antenna elements 106 of the planar antenna array 102. In one embodiment, the reflector antenna 104 focuses radiation for the planar antenna array 102. The reflector antenna 104, in the depicted embodiment, is a parabolic dish reflector antenna 104. The patch antenna elements 106, in one embodiment, produce a radiation pattern that is matched to a focal length of the reflector antenna 104 divided by a diameter of the reflector antenna 104 ("f/d"), to maintain the radiation efficiency of the planar antenna array 102. For example, dimensions of the planar antenna array 102, embodiments of which are described below with regard to FIG. 4, may be selected so that the planar antenna array 102 produces a radiation pattern that is optimally matched to the reflector antenna 104, or the like. The planar antenna array 102, in certain embodiments, may be fed with one or more passive feed networks, such as the depicted corporate feed networks.

In one embodiment, the system 100 includes a protective layer such as a housing, radome, coating, chemical treatment, or the like, that protects the planar antenna array 102 from the environment. The protective layer may be substantially transparent to electromagnetic signals, at least in bands utilized by the planar antenna array 102, so that the protective layer adds little or no attenuation or noise to electromagnetic signals for the planar antenna array 102.

FIG. 1B depicts another embodiment of a system 112 for wireless communications. The system 112 of FIG. 1B includes a planar antenna array 102 with several planar patch antenna elements 106 surrounded by one or more slots 108 and a ground plane 110, but instead of using a reflector antenna 104, the planar antenna array 102 comprises an aperture antenna array or flat panel type antenna array, without a reflector antenna 104. In certain embodiments, an aperture planar antenna array 102 as depicted in FIG. 1B includes more patch antenna elements 106 than a similar or equivalent antenna array feed such as the planar antenna array 102 and reflector antenna 104 depicted in FIG. 1A and described above, because there is no reflector antenna 104 to focus radiation.

The planar antenna array 102, in the depicted embodiment, is an active array feed antenna, with beam steering electronics, such as variable gain amplifiers, phase shifters, and/or other electrical devices to electronically steer the antenna beam. The beam steering electronics may be disposed on the same substrate with the patch antenna elements 106 (on the same surface or an opposite surface), may be in communication with the patch antenna elements 106 through one or more routing layers, or may otherwise be in communication with the patch antenna elements 106. Because the feed points for the patch antenna elements 106 are not tied together in the embodiment of FIG. 1B but are coupled to beam steering electronics, a separate slot 108 circumscribes each patch antenna element 106 with any associated feed lines and/or I/O ports.

FIG. 2A depicts a first embodiment of a slot patch antenna 200. The slot patch antenna 200, in the depicted embodiment, includes a planar patch antenna element 106 surrounded by a slot 108 and a ground plane 110, substantially as described above with regard to FIGS. 1A and 1B. The slot patch antenna 200 further includes a feed point 202, a feed line 204, and a feed point I/O port 206 for the patch antenna element 106. While the slot patch antenna 200, in the depicted embodiment, includes a single patch antenna element 106 for clarity, in other embodiments, the slot patch antenna 200 may include several patch antenna elements 106 arranged in an antenna array as described above with regard to FIGS. 1A and 1B.

The feed point 202 may be used as a receive feed point to conduct communications signals away from the patch antenna element 106 or as a transmit feed point to conduct communications signals to the patch antenna element 106. The feed point 202 is a point at which the feed line 204 interfaces with the patch antenna element 106. The feed point 202, in the depicted embodiment, is located toward the middle point of the side of the patch antenna element 106 to prevent unwanted modes from being excited in the patch antenna element 106. The feed line 204, in the depicted embodiment, includes a grounded coplanar waveguide, GCPW, formed by the ground plane 110 and the slot 108, which circumscribe the feed line 204.

The feed point I/O port 206 may be used as a receive feed point output port to provide received signals from the patch antenna element 106 for processing or used as a transmit feed point input port to receive signals for transmitting using the patch antenna element 106. In one embodiment, the feed point I/O port 206 includes an electrically conductive via that conducts communications signals through the substrate of the slot patch antenna 200, to or from one or more routing layers, to or from one or more electrical devices, or the like. In another embodiment, the feed point I/O port 206 includes a surface mount connector or the like that conducts communications signals to or from an external device.

The feed point I/O port 206, in the depicted embodiment, is in communication with a single patch antenna element 106. In a further embodiment, the feed point I/O port 206 may be in communication with a feed network with several feed lines 204 coupled to feed points 202 for several patch antenna elements 106. In light of this disclosure, one of skill in the art will recognize other configurations suitable for use with the patch antenna element 106, the feed point 202, the feed line 204, and the feed point I/O port 206.

FIG. 2B depicts a second embodiment of a slot patch antenna 210. The slot patch antenna 210, in the depicted embodiment, is substantially similar to the slot patch antenna 200 of FIG. 2A, but further includes a second feed point 212, a second feed line 214, and a second feed point I/O port 216. One corresponding set of the feed points 202, 212, the feed lines 204, 214, and the feed point I/O ports 206, 216 forms a receive feed network and the other corresponding set forms a transmit feed network.

For example, in one embodiment, the first feed point 202, the first feed line 204, and the first feed point I/O port 206 are part of a receive feed network and the second feed point 212, the second feed line 214, and the second feed point I/O port 216 are part of a transmit feed network. Both feed points 202, 212, in the depicted embodiment, are located at or near middle points of their sides of the patch antenna element 106 to prevent unwanted modes from being excited in the patch antenna element 106 and to provide isolation for the feed points 202, 212.

In the depicted embodiment, the second feed point 212 is disposed on an orthogonal, perpendicular side of the patch antenna element 106 from the first feed point 202, so that the first feed point 202 and the second feed point 212 excite radiation patterns with orthogonal polarizations. The first feed point 202 excites a vertical linear radiation pattern and the second feed point 212 excites a horizontal linear radiation pattern, so that the feed points 202, 212 excite the patch antenna elements 106 in orthogonal transverse modes TM10 and TM01. In another embodiment, instead of orthogonal linear polarizations, the first feed point 202 and the second feed point 212 may have orthogonal circular polarizations, with one having a right-hand polarization and one having a left-hand polarization, or the like.

The orthogonal sides of the patch antenna element 106, in the depicted embodiment, have different lengths, so that the first feed point 202 and the second feed point 212 are tuned to different frequencies, making the patch antenna element 106 dual band. For example, in an embodiment where the patch antenna element 106 is configured for the Ku band, the first feed point 202 may be tuned to receive Ku band satellite downlink signals in the 11.7 to 12.2 GHz range and the second feed point 212 may be tuned to transmit Ku band satellite uplink signals in the 14 to 14.5 GHz range, or the like.

FIG. 2C depicts a third embodiment of a slot patch antenna 220. The slot patch antenna 220, in the depicted embodiment, is substantially similar to the slot patch antenna 210 of FIG. 2B, but the first feed point 202 comprises a capacitive coupling 222. The capacitive coupling 222, in certain embodiments, provides greater electrical isolation between the first feed point 202 and the second feed point 212 than the embodiment described above with regard to FIG. 2B.

The capacitive coupling 222 is between the patch antenna element 106 and the first feed point 202 to electrically isolate the first feed point 202 from the second feed point 212, isolating a receive feed point from a transmit feed point or the like. In the depicted embodiment, the capacitive coupling 222 includes an elongate conductor that is parallel to a side of the patch antenna element 106. The slot 108, in the depicted embodiment, extends between the elongate conductor and the side of the patch antenna element 106, so that the exposed dielectric material of the substrate separates the elongate conductor from the side of the patch antenna element 106. In one embodiment, the capacitive coupling 222 is part of a receive feed point, as a transmit feed point typically operates with higher powered signals than a receive feed point. In another embodiment, the capacitive coupling 222 may be part of a transmit feed point. The elongate conductor shape or slim bar shape of the capacitive coupling 222, in one embodiment, acts as an inductive/capacitive ("LC") match circuit for the patch antenna element 106.

Figure 4:
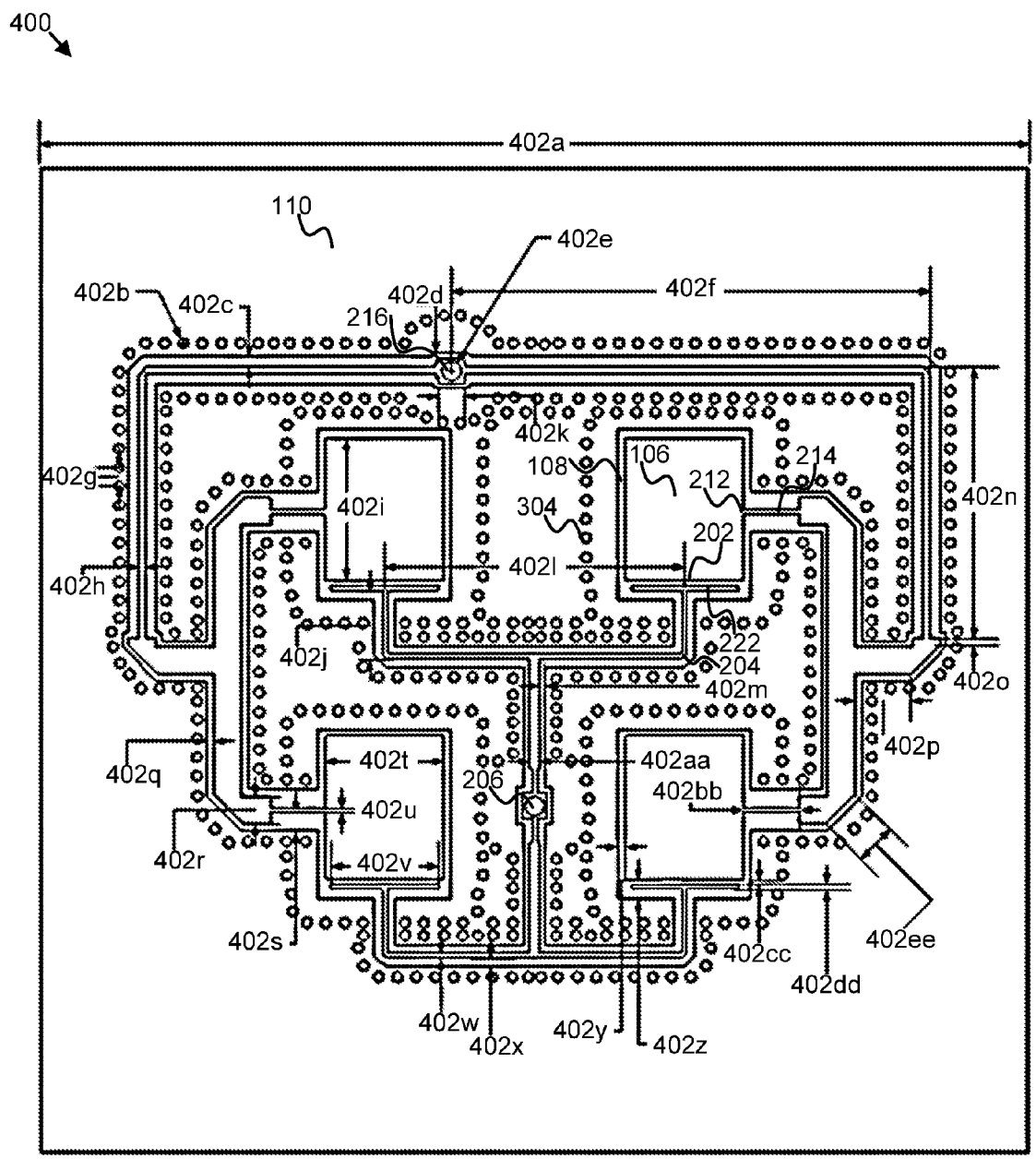
FIG. 4 is a schematic block diagram illustrating one embodiment of a slot patch antenna in accordance with the present invention.

In one embodiment the first feed point 202 and the second feed point 212 and associated feed networks are designed for impedance matching. In the depicted embodiment, the second feed point 212 is disposed on a longer side of the patch antenna element 106, which has a lower input impedance due to its longer length. In one embodiment, a quarter wavelength transformer may be applied to match a 50 Ohm feed line 214 with the horizontal mode second feed point 212, or the like. In certain embodiments, the capacitive coupling 222 may be used to match the vertical mode first feed point 202 with a 100 Ohm feed line 204, or the like. One embodiment where widths of the feed lines 204, 214 and other characteristics of the feed networks are selected for impedance matching is depicted in FIG. 4 and described below.

FIG. 2D depicts a fourth embodiment of a slot patch antenna 230. The slot patch antenna 230, in the depicted embodiment, is substantially similar to the slot patch antenna 220 of FIG. 2C, but further includes a second capacitive coupling 232. Including a first capacitive coupling 222 for the first feed point 202 and a second capacitive coupling 232 for the second feed point 212, in certain embodiments, provides greater electrical isolation between the feed points 202, 212, or the like.

Figure 3A:
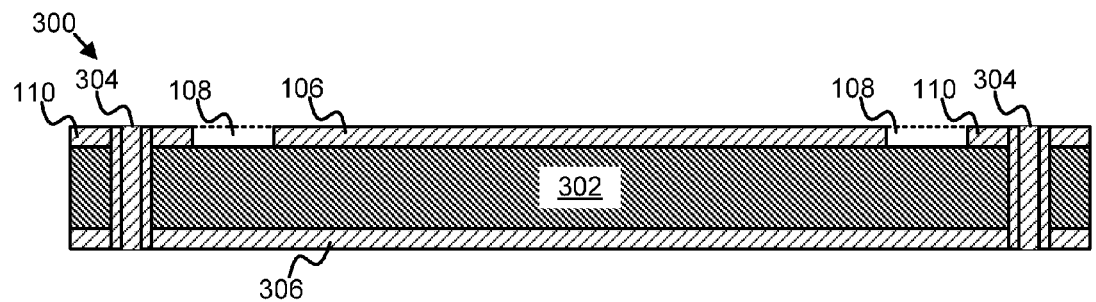
FIG. 3A is a cross-sectional view illustrating one embodiment of a slot patch antenna in accordance with the present invention.

FIG. 3A is a cross-sectional view depicting one embodiment of a slot patch antenna 300. The slot patch antenna 300, in the depicted embodiment, includes a substrate 302, with a planar patch antenna element 106 and a ground plane 110 disposed on a surface of the substrate 302 and with a slot 108 between the patch antenna element 106 and the ground plane 110. In the depicted embodiment, electrically conductive vias 304 around the patch antenna element 106 connect the ground plane 110 through the substrate 302 to an opposite ground plane 306. While a single patch antenna element 106 is depicted, in various embodiments, the slot patch antenna 300 may extend further in either horizontal direction, and may include one or more additional patch antenna elements 106 that are substantially similar to the depicted patch antenna element 106.

In one embodiment, the substrate 302 includes a dielectric material, such as epoxy, fabric, glass, paper, polymer, ceramic, and/or other electrically insulating materials. The substrate 302, in certain embodiments, is a PCB, such as an FR-4 PCB, a radio frequency ("RF") or microwave class PCB, or the like. The substrate 302 provides mechanical support and electrical connections for the slot patch antenna 300, and acts as a spacer between the planar patch antenna element 106 and the opposite ground plane 306.

The conductive vias 304 are electrical connections that extend through the substrate 302 to connect the ground plane 110 with the opposite ground plane 306. The conductive vias 304, in certain embodiments, are arranged around a perimeter of the patch antenna elements 106 and/or around a perimeter of the slot 108 to reduce or eliminate surface waves, to suppress cavity modes in the substrate 302, or the like. The conductive vias 304 may include through holes, blind vias, buried vias, or the like and may be plated, lined, or filled with a conductor such as copper.

The opposite ground plane 306 is an electrically conductive layer disposed on an opposite side of the substrate 302 from the patch antenna element 106 and the ground plane 110. The opposite ground plane 306 may be described as a bottom or back ground plane. The opposite ground plane 306, in certain embodiments, blocks, reduces, or reflects radiation directed behind the patch antenna element 106 to increase the efficiency of the patch antenna element 106. In the depicted embodiment, the opposite ground plane 306 has a footprint or surface area that is as large as or larger than a footprint or surface area of the patch antenna element 106. In one embodiment, the conductive layer of the opposite ground plane 306 may include one or more electrical connections for the slot patch antenna 300 that are isolated from the opposite ground plane 306 by one or more slots or the like.

In certain embodiments, the slot patch antenna 300 is a passive array feed antenna or a passive aperture antenna array and signals to and/or from the patch antenna elements 106 are not manipulated for beam steering purposes. Because the patch antenna element 106, the slot 108, and the ground plane 110 are each disposed on a single surface of the substrate 302 and within the same plane, in the depicted embodiment, the slot patch antenna 300 has three layers, and is relatively simple and inexpensive to manufacture. In one embodiment, the slot patch antenna 300 includes one or more electrical devices such as a low noise amplifier, a block downconverter, a power amplifier, a block upconverter, or the like that are in communication with the patch antenna element 106 to process signals for the patch antenna element 106. The one or more electrical devices may be disposed on either surface of the substrate 302, may be in communication with the patch antenna element 106 through one or more routing layers, or may otherwise be in communication with the patch antenna element 106.

Figure 3B:
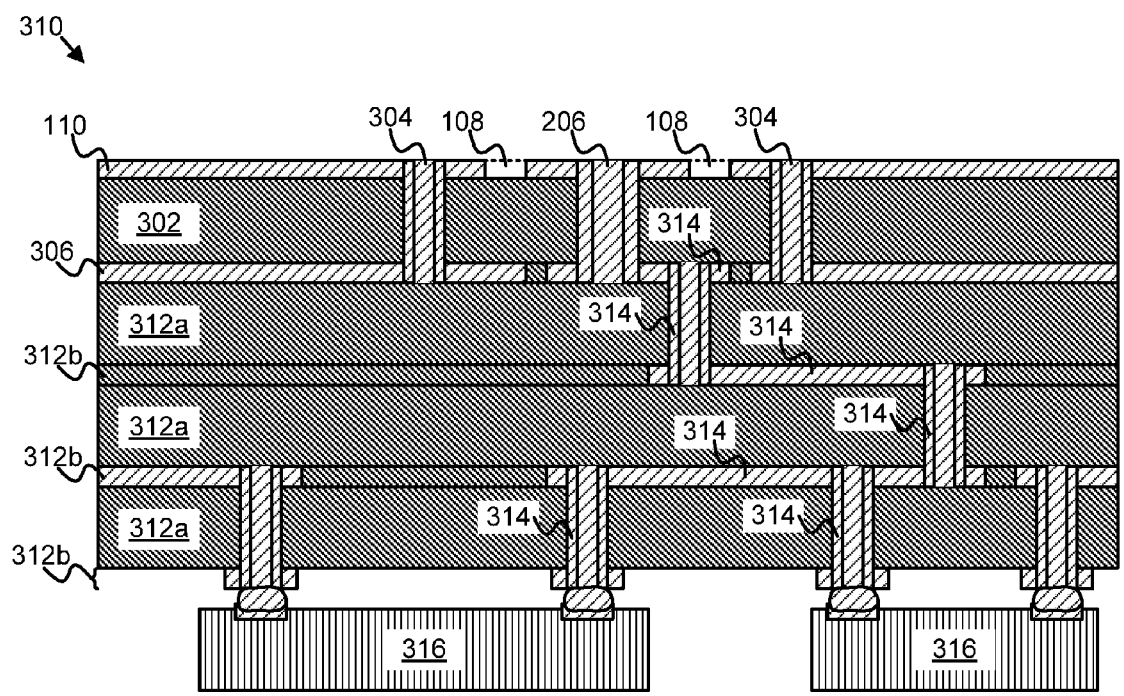
FIG. 3B is a cross-sectional view illustrating another embodiment of a slot patch antenna in accordance with the present invention.

FIG. 3B is a cross-sectional view depicting another embodiment of a slot patch antenna 310. The slot patch antenna 310, in the depicted embodiment, includes a substrate 302, substantially as described above with regard to FIG. 3A, and also includes several routing layers 312. The routing layers 312 include internal connections 314 which conduct electrical signals between feed point I/O ports 206 for patch antenna elements 106 on a surface of the substrate 302 and one or more electrical devices 316.

In the depicted embodiment, a feed point I/O port 206, which may be used as a receive feed point output port and/or a transmit feed point input port, includes a conductive via through the substrate 302 to an internal connection 314 formed in the electrically conductive material of the opposite ground plane 306. The internal connection 314 is electrically isolated from the opposite ground plane 306 by dielectric material. The feed point I/O port 206 may conduct signals for a single patch antenna element 106 or for several patch antenna elements 106 that are tied together.

The routing layers 312, in the depicted embodiment, include insulating dielectric routing layers 312a and conductive routing layers 312b, with internal connections 314 of electrically conductive material to conduct electrical signals for patch antenna elements 106. The routing layers 312 are disposed on a opposite side of the opposite ground plane 306 from the substrate 302. The internal connections 314, in the depicted embodiment, include conductive vias through the dielectric routing layers 312a and electrical paths formed in the conductive routing layers 312b. While a single feed point I/O port 206 is illustrated in the cross-sectional view of the slot patch antenna 310, in other embodiments, the routing layers 312 may conduct electrical signals for multiple feed point I/O ports 206. For example, in an embodiment where the slot patch antenna 310 includes a four by four dual band antenna array, where each patch antenna element 106 includes two feed point I/O ports 206 for a total of thirty-two feed point I/O ports 206, the internal connections 314 of the routing layers 312 may conduct electrical signals for the thirty-two feed point I/O ports 206.

In the depicted embodiment, the internal connections 314 electrically couple the feed point I/O port 206 for one or more patch antenna elements 106 to the electrical devices 316. In one embodiment, the electrical devices 316 include integrated circuit devices. In another embodiment, the electrical devices 316 include discrete electrical components. The electrical devices 316, in certain embodiments, may include a low noise amplifier, a block downconverter, a power amplifier, a block upconverter, or the like for either a passive or active antenna array. In one embodiment, the electrical devices 316 include one or more variable gain amplifiers, one or more phase shifters, or the like for an active antenna array. Variable gain amplifiers adjust an amplitude of communications signals for patch antenna elements 106 and phase shifters adjust a phase of communications signals for patch antenna elements 106. Adjusting the amplitude and phase of communications signals for individual patch antenna elements 106 in a phased array electronically steers the communications beam associated with the patch antenna elements 106 without physically manipulating the patch antenna elements 106. In the depicted embodiment, the electrical devices 316 are coupled to a surface of the slot patch antenna 310 using a solder ball grid array or the like.

FIG. 4 depicts one embodiment of a slot patch antenna 400. The slot patch antenna 400 is a passive array feed for use with a reflector antenna 104. The patch antenna elements 106, in the depicted embodiment, are wired together by feed lines 204, 214 of passive feed networks without beam steering electronics. The slot patch antenna 400 is a four element orthogonal polarized dual band planar passive slot patch antenna array feed. In certain embodiments, the passive slot patch antenna 400 may be a functionally equivalent plug-in replacement for a standard horn-type feed antenna and OMT. Depending on the selected dimensions 402, the slot patch antenna 400 may be configured or tuned for the Ku band, Ka band, C band, or other frequency ranges. The depicted dimensions 402 of the slot patch antenna 400, in one embodiment, are selected so that the slot patch antenna 400 has a measured radiation efficiency of at least ninety percent. Radiation efficiency for an antenna is the ratio of the amount of power that the antenna radiates to the amount of power supplied to the antenna. In a further embodiment, the slot patch antenna 400 with associated dimensions 402 has a radiation efficiency of at least ninety-four percent and when used as a reflector feed antenna, may realize an illumination efficiency of seventy percent or more.

Each of the four patch antenna elements 106 and corresponding slot 108, in the depicted embodiment, is an orthogonal polarized dual band slot patch antenna element 106. A 1:4 equal phase feed network for the receive band includes the first feed point I/O port 206 as a receive feed point output port with corresponding first feed lines 204, capacitive couplings 222, and first feed points 202. A 180 degree phase shifted feed network for the transmit band includes the second feed point I/O port 216 as a transmit feed point input port with corresponding second feed lines 214 and second feed points 204. Conductive vias 304 are arranged around the patch antenna elements 106, the slot 108, the feed lines 204, 214, and the feed point I/O ports 206, 216, connecting the ground plane 110 through the substrate 302 to the opposite ground plane 306. The one or more slots 108 circumscribe the patch antenna elements 106 and the feed lines 204, 214, forming a grounded coplanar waveguide, GCPW, for the feed lines 204, 214.

The two feed networks, in the depicted embodiment, are disposed on the same layer with minimal routing or twisting of the feed lines 204, 214 while maintaining isolation between the feed networks. The equal phase feed network for the receive band has minimal, equal path lengths for the first feed lines 204, to provide high efficiency for receiving. The 180 degree phase shifted feed network for the transmit band has longer path lengths for the second feed lines 214, which are toward a perimeter of the patch antenna elements 106 to isolate the second feed lines 214 from the first feed lines 204, which are toward an interior of the patch antenna elements 106.

The left side patch antenna elements 106 and the right side patch antenna elements 106 are fed from outside edges, with the second feed points 212 on opposing sides of the patch antenna elements 106, providing an intrinsic phase difference of 180 degrees. To compensate for the 180 degree phase difference, the second feed point I/O port 216 is offset toward a first subset of the patch antenna elements 106 (the left side patch antenna elements 106 in the depicted embodiment) and away from a second subset of the patch antenna elements 106 (the right side patch antenna elements 106 in the depicted embodiment) to provide a 180 degree phase shift at the associated operating frequency.

In certain embodiments, the second feed point I/O port 216 is offset one quarter wavelength toward the first subset of the patch antenna elements 106 and one quarter wavelength away from the second subset of the patch antenna elements 106 to provide a half wavelength path difference between path lengths of second feed lines 214 for the first subset of the patch antenna elements 106 and the second subset of the patch antenna elements 106. A half wavelength path difference produces a 180 degree phase shift to compensate for the intrinsic 180 degree phase difference. In one embodiment, due to the 180 degree phase shift, energy coupled from the left patch antenna elements 106 (the first subset) may be cancelled out by the right patch antenna elements 106 (the second subset). Additionally, in certain embodiments, because the feed networks are out-of-phase due to the 180 degree phase shift, coupling energy is also cancelled between feed networks, further increasing isolation and reducing noise.

Various non-limiting embodiments of dimensions 402 for the passive slot patch antenna 400 that is configured for dual-band operation in the Ku band are described below, for example purposes only. The described dimensions 402 are selected for a substrate thickness of between about 0.03 and 0.035 inches. One of skill in the art, in light of this disclosure, will recognize adjustments to the described dimensions 402 for operation in the Ka band, C band, at other communications frequencies, for other substrate thicknesses, for other design considerations, and the like. The distance between patch antenna elements 106, in one embodiment, is about half a wavelength. The offset of the second feed point I/O port 216, in one embodiment, is about 0.138 inches to produce 180 degree phase shift at a Ku band operating frequency.

A dimension 402$a$ for a width of the slot patch antenna 400 may be about 1.63 inches, and the slot patch antenna 400 may be substantially square. A dimension 402$b$ for a diameter of the conductive vias 304 may be about 0.016 inches. A dimension 402$c$ for a width of the slot 108 around the second feed line 214 may be about 0.018 inches. A dimension 402$d$ for a width of the slot 108 around a feed point I/O port 206, 216 may be about 0.008 inches. A dimension 402$e$ for a diameter of a feed point I/O port 206, 216 may be about 0.032 inches. A dimension 402$f$ for a horizontal offset path length for the second feed line 214 may be about 0.792 inches.

A dimension 402$g$ for a distance between conductive vias 304 may be about 0.032 inches. A dimension 402$h$ for a width of the second feed line 214 may be about 0.01 inches. A dimension 402$i$ for a height of the patch antenna elements 106 may be about 0.238 inches. A dimension 402$j$ for a first length of the first feed line 204 may be about 0.115 inches. A dimension 402$k$ for a width of the slot 108 around a feed point I/O port 206, 216 may be about 0.043 inches. A dimension 402$l$ for a distance between horizontal midpoints of the patch antenna elements 106 may be about 0.496 inches.

A dimension 402$m$ for a width of the slot 108 around the first feed lines 204 may be about 0.008 inches. A dimension 402$n$ for a vertical path length for the second feed line 214 may be about 0.45 inches. A dimension 402$o$ for a vertical length of an increased width portion of the second feed line 214 may be about 0.01 inches. A dimension 402$p$ for a horizontal length of an increased width portion of the second feed line 214 may be about 0.091 inches.

A dimension 402$q$ for a width of the slot 108 around an increased width portion of the second feed line 214 may be about 0.01 inches. A dimension 402$r$ for a width of an increased width portion of the second feed line 214 may be about 0.046 inches. A dimension 402$s$ for a width of the slot 108 around the second feed line 214 adjacent to the second feed point 212 may be about 0.029 inches. A dimension 402$t$ for a width of the patch antenna elements 106 may be about 0.197 inches. A dimension 402$u$ for a width of the feed line 214 at the second feed point 212 may be about 0.008 inches.

A dimension 402$v$ for a width of the capacitive coupling 222 may be about 0.177 inches. A dimension 402$w$ for a width of the first feed line 204 may be about 0.008 inches. A dimension 402$x$ for a width of the slot 108 around the first feed line 204 may be about 0.013 inches. A dimension 402$y$ for a width of the slot 108 around the patch antenna elements 106 may be about 0.012 inches. A dimension 402$z$ for a width of the slot 108 around the capacitive coupling 222 may be about 0.032 inches.

A dimension 402$aa$ for a width of an increased width portion of the first feed line 204 may be about 0.017 inches. A dimension 402$bb$ for a length of the second feed line 214 between the patch antenna elements 106 and an increased width portion of the second feed line 214 may be about 0.091 inches. A dimension 402 cc for width of the slot 108 or other gap between the patch antenna element 106 and the capacitive coupling 222 may be about 0.008 inches. A dimension 402$dd$ for a width of the capacitive coupling 222 may be about 0.008 inches. A dimension 402$ee$ for a length of an angled wall of an increased width portion of the second feed line 214 may be about 0.07 inches.

Figure 5:
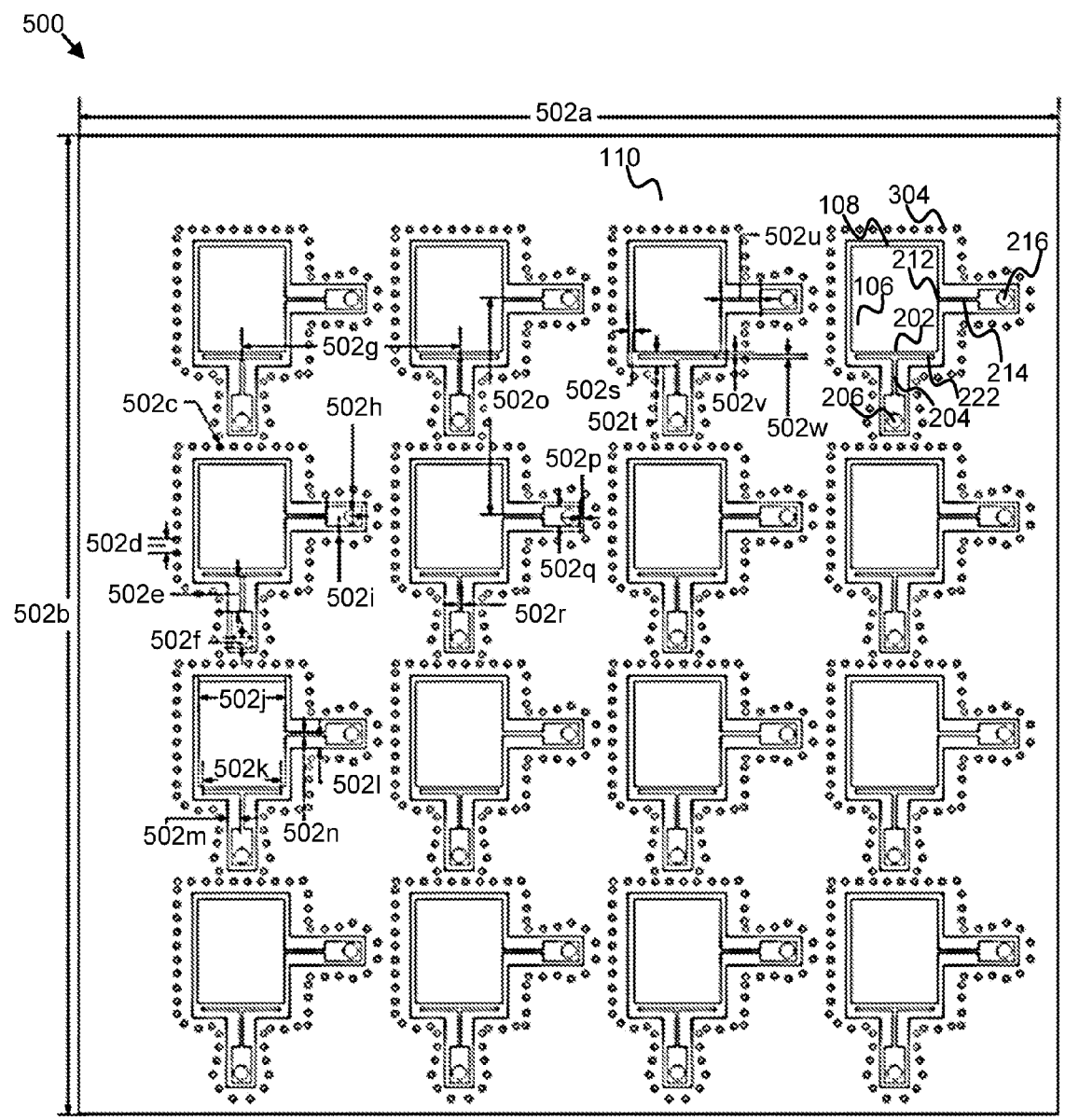
FIG. 5 is a schematic block diagram illustrating a further embodiment of a slot patch antenna in accordance with the present invention.

FIG. 5 depicts a further embodiment of a slot patch antenna 500. The slot patch antenna 500, in the depicted embodiment, is an orthogonal polarized dual band planar slot patch active antenna array feed, with a four by four array of sixteen dual band, linearly polarized patch antenna elements 106. The slot patch antenna 500, in one embodiment, may operate as a feed for a parabolic dish type reflector antenna 104 or the like. In certain embodiments, the active slot patch antenna 500 may be functionally equivalent to a pattern flexible horn-type feed antenna and OMT. Depending on the selected dimensions 502, the slot patch antenna 500 may be configured or tuned for the Ku band, Ka band, C band, or other frequency ranges. The depicted dimensions 502 of the slot patch antenna 500, in one embodiment, are selected so that the slot patch antenna 400 has a measured radiation efficiency of at least ninety-five percent. In a further embodiment, the slot patch antenna 500 with associated dimensions 502 has a radiation efficiency of at least ninety percent.

In certain embodiments, a two by two passive array feed, as described above with regard to FIG. 4, is adequate to utilize a Ku band reflector antenna 104 efficiently. For a beam steering phased array feed such as the slot patch antenna 500, in one embodiment, the twelve patch antenna elements 106 surrounding the center four patch antenna elements 106 may be fed with smaller amplitude signals than the center patch antenna elements 106 to produce a boresight communications beam along an axis of the corresponding reflector antenna 104. The phases for the patch antenna elements 106, in certain embodiments, are optimally selected to produce a high quality beam pattern with low sidelobes. In certain embodiments, to steer the beam, the amplitudes of the driving microwave signals at feed point I/O ports 206, 216 for various patch antenna elements 106 are adjusted. The phases may also be adjusted to maintain low sidelobes, high gain, or the like.

Various non-limiting embodiments of dimensions 502 for the active slot patch antenna 500 that is configured for dual-band operation in the Ku band are described below, for example purposes only. The described dimensions 502 are selected for a substrate thickness of between about 0.03 and 0.035 inches, with various additional routing layers as described above with regard to FIG. 3B. One of skill in the art, in light of this disclosure, will recognize adjustments to the described dimensions 502 for operation in the Ka band, C band, at other communications frequencies, for other substrate thicknesses, for other design considerations, and the like. The distance between patch antenna elements 106, in one embodiment, is about half a wavelength.

Dimensions 502a and 502b for a width and height of a square slot patch antenna 500 may be about 2.215 inches each. A dimension 502c for a diameter of a conductive via 304 may be about 0.016 inches. A dimension 502d for a distance between conductive vias may be about 0.032 inches. A dimension 502e for a length of the first feed line 204 may be about 0.082 inches. A dimension 502f for a vertical offset for a center of the first feed point I/O port from the slot 108 may be about 0.023 inches. A dimension 502g for a distance between horizontal midpoints of the patch antenna elements 106 may be about 0.492 inches. A dimension 502h for a diameter of a feed point I/O port 206, 216 may be about 0.032 inches. A dimension 502i for the slot 108 around a feed point I/O port 206 may be about 0.059 inches.

A dimension 502j for a width of a patch antenna element 106 may be about 0.197 inches. A dimension 502k for a width of the capacitive coupling 222 may be about 0.177 inches. A dimension 502l for a width of the slot 108 around the second feed line 214 adjacent to the second feed point 212 may be about 0.029 inches. A dimension 502m for a width of the slot 108 around the first feed line 204 may be about 0.019 inches. A dimension 502n for a width of the second feed line 214 may be about 0.008 inches.

A dimension 502o for a distance between vertical midpoints of the patch antenna elements 106 may be about 0.492 inches. A dimension 502p for a width of the slot 108 around a feed point I/O port 206, 216 may be about 0.01 inches. A dimension 502q for a width of a conductor for a feed point I/O port 206, 216 may be about 0.046 inches. A dimension 502r for a width of the first feed line 204 may be about 0.008 inches.

A dimension 502s for a width of the slot 108 around the patch antenna elements 106 may be about 0.012 inches. A dimension 502t for a width of the slot 108 around the capacitive coupling 222 may be about 0.032 inches. A dimension 502u for a length of the second feed line 214 may be about 0.091 inches. A dimension 502v for a width of the slot 108 or other gap between the patch antenna element 106 and the capacitive coupling 222 may be about 0.008 inches. A dimension 502w for a width of the capacitive coupling 222 may be about 0.008 inches.

Figure 6:
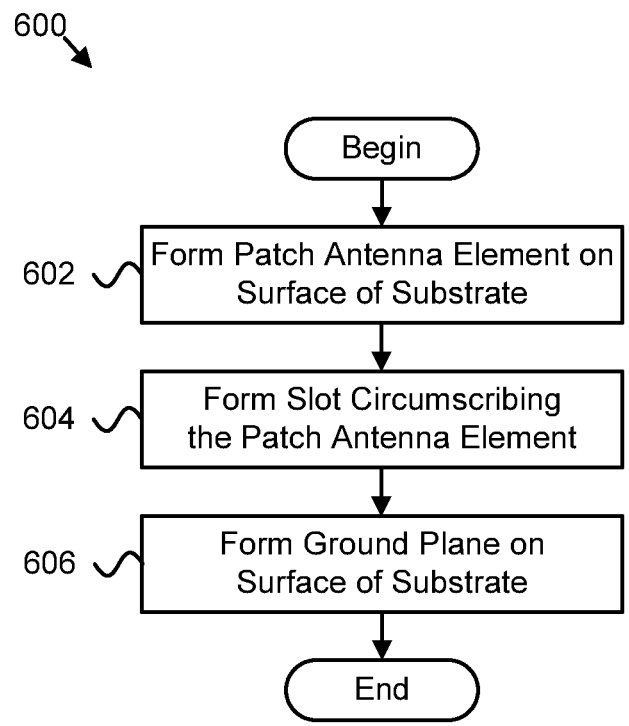
FIG. 6 is a schematic flow chart diagram illustrating one embodiment of a method for forming an antenna for wireless communications in accordance with the present invention.

FIG. 6 depicts one embodiment of a method 600 for forming an antenna for wireless communications. The method 600 may be performed by an assembler, such as an automated assembly process, a manual assembly worker, a chemical process, a mechanical process, and/or another assembler. The method 600 begins, and an assembler forms 602 a planar patch antenna element 106 on a surface of a substrate 302. The planar patch antenna element 106, in certain embodiments, is formed 602 of an electrically conductive material, while the substrate 302 includes a dielectric material. As described below with regard to FIG. 7, in certain embodiments, an assembler may form a receive feed point 202 and/or a transmit feed point 212 of the planar patch antenna element 106. A receive feed point 202 may be tuned to a first frequency and a transmit feed point 212 may be tuned to a second frequency so that the planar patch antenna element 106 is configured to transmit and receive at different frequencies.

An assembler forms 604 a slot 108 in the electrically conductive material of the patch antenna element 106. The slot 108, in one embodiment, circumscribes the patch antenna element 106. In certain embodiments, the slot 108 exposes the dielectric material of the substrate 302. An assembler forms 606 a ground plane 110 on the surface of the substrate 302 and the method 600 ends. The ground plane 110, in a further embodiment, is formed 606 of an electrically conductive material. In one embodiment, the slot 108 is disposed between the ground plane 110 and the patch antenna element 106.

In certain embodiments, an assembler may perform several steps of the method 600 substantially simultaneously. For example, in one embodiment, an assembler may etch, dissolve, or otherwise remove electrically conductive material from a conductive surface layer on the substrate 302 in a predefined pattern or mask to form 602 the patch antenna element 106, form 604 the slot 108, and form 606 the ground plane 110 substantially simultaneously. In another embodiment, an assembler may deposit, seed, form, bond, or otherwise attach electrically conductive material to the substrate 302 in a predefined pattern or mask to form 602 the patch antenna element 106, form 604 the slot 108, and form 606 the ground plane 110 substantially simultaneously.

Figure 7:
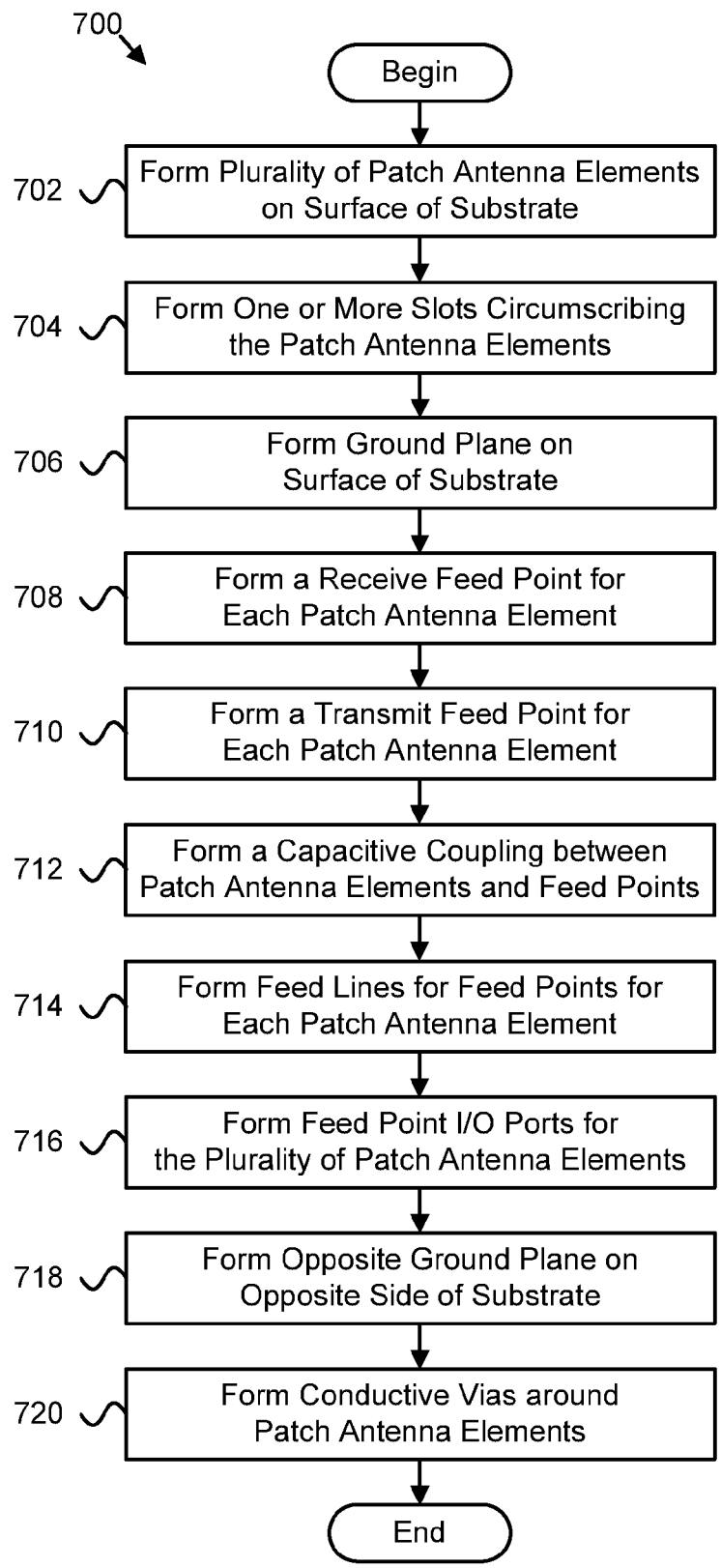
FIG. 7 is a schematic flow chart diagram illustrating a further embodiment of a method for forming an antenna array for wireless communications in accordance with the present invention.

FIG. 7 depicts a further embodiment of a method 700 for forming an antenna array for wireless communications. The method 700 begins, and an assembler forms 702 a plurality of electrically conductive planar patch antenna elements 106 on a surface of a dielectric substrate 302. An assembler forms 704 one or more slots 108 circumscribing the patch antenna elements 106, exposing dielectric material of the substrate 302. An assembler forms 706 an electrically conductive ground plane 110 on the surface of the substrate 302. In one embodiment, the one or more slots 108 are disposed between the ground plane 110 and the patch antenna element 106.

In the depicted embodiment, an assembler forms 708 a receive feed point 202 for each patch antenna element 106 and forms 710 a transmit feed point 212 for each patch antenna element 106. An assembler forms 712 a capacitive coupling 222 between each of the patch antenna elements 106 and the corresponding receive feed point 202 and/or the corresponding transmit feed point 212. An assembler forms 714 feed lines 204, 214 for the feed points 202, 212 for each patch antenna element 106.

An assembler forms 716 feed point I/O ports 206, 216 for the patch antenna elements 106. For a passive embodiment, the assembler may form 716 a single receive input port 206 and/or a single transmit output port 216 that is in communication with each of the patch antenna elements 106 using a feed network of feed lines 204, 214. For an active beam steering embodiment, the assembler may form 716 separate receive input ports 206 and/or separate transmit output ports 216 for each of the patch antenna elements 106.

An assembler forms 718 an opposite ground plane 306 on an opposite side of the substrate 302 from the ground plane 110. An assembler forms 720 conductive vias 304 around the patch antenna elements 106, extending through the substrate 302 between the ground plane 110 and the opposite ground plane 306 and the method ends. In further embodiments, an assembler may couple one or more routing layers 312 to the opposite ground plane 306; may couple one or more electrical devices 316 to conductive contacts of the routing layers 312 and/or to conductive contacts on the surface of the substrate 302; may install a completed planar antenna array 102 opposite a reflector antenna 104; and/or may perform other steps to form an embodiment of the planar antenna arrays 102, 200, 210, 220, 230, 300, 310, 400, 500, including slot patch antenna arrays, described herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for wireless communications, the apparatus comprising:
   a planar patch antenna element disposed on a surface of a substrate, the planar patch antenna having a rectangular shape with a first side having a first length and a second side having a second length different than the first length, the second side being orthogonal to the first side, the planar patch antenna element comprising:
   an electrically conductive material, the substrate comprising a dielectric material,
   a receive feed point of the planar patch antenna element tuned to a first frequency corresponding to the first length, and
   a transmit feed point of the planar patch antenna element tuned to a second frequency corresponding to the second length and different than the first frequency, wherein the planar patch antenna element transmits and receives at different frequencies;
   a receive feed line disposed on the surface of the substrate, the receive feed line in communication with the planar patch antenna element;
   a transmit feed line disposed on the surface of the substrate, the transmit feed line in communication with the planar patch antenna element;
   a closed slot in the electrically conductive material of the planar patch antenna element,
   the slot circumscribing the planar patch antenna element, the receive feed line, and the transmit feed line, the slot exposing the dielectric material of the substrate;
   a ground plane disposed on the surface of the substrate, the ground plane comprising an electrically conductive material, the slot disposed between the ground plane and the planar patch antenna element;
   and a capacitive coupling between the planar patch antenna element and at least one of the receive feed line and the transmit feed line, the capacitive coupling providing electrical isolation between the receive feed point and the transmit feed point, wherein the capacitive coupling comprises an elongate conductor disposed parallel to a side of the planar patch antenna element;
   wherein dimensions of the planar patch antenna element and the closed slot are selected such that the planar antenna element and the closed slot have a radiation efficiency of at least ninety percent.

2. The apparatus of claim 1, wherein the slot extends between the elongate conductor and the side of the planar patch antenna element such that the exposed dielectric material of the substrate separates the elongate conductor from the side of the planar patch antenna element.

3. The apparatus of claim 1, wherein the transmit feed point is disposed on an orthogonal side of the planar patch antenna element to a side of the planar patch antenna element on which the receive feed point is disposed such that the transmit feed point and the receive feed point excite radiation patterns with orthogonal polarization relative to each other.

4. The apparatus of claim 1, further comprising one or more additional patch antenna elements, the planar patch antenna element and the one or more additional patch antenna elements forming a plurality of patch antenna elements arranged in an antenna array.

5. The apparatus of claim 4, wherein a feed point input/output ("I/O") port for the plurality of patch antenna elements is offset toward a first subset of the plurality of patch antenna elements and away from a second subset of the plurality of patch antenna elements and feed points corresponding to the feed point I/O port are disposed on one side of the first subset of the plurality of patch antenna elements and are disposed on an opposing side of the second subset of the plurality of patch antenna elements, the feed point I/O port comprising one of a receive feed point output port and a transmit feed point input port.

6. The apparatus of claim 5, wherein the offset comprises a one quarter wavelength offset such that a half wavelength path difference exists between the first subset of the plurality of patch antenna elements and the second subset of the plurality of patch antenna elements.

7. The apparatus of claim 4, wherein feed lines for one of the receive feed point and the transmit feed point for each patch antenna element are disposed toward a perimeter of the plurality of patch antenna elements and feed lines for another of the receive feed point and the transmit feed point for each patch antenna element are disposed toward an interior of the plurality of patch antenna elements, the feed liens disposed on the surface of the substrate.

8. The apparatus of claim 4, wherein the antenna array comprises a prime focus feed for a reflector antenna, the antenna array configured to illuminate the reflector antenna from a location at a primary focus of the reflector antenna.

9. The apparatus of claim 4, wherein the antenna array comprises an aperture array configured for wireless communications without a reflector antenna.

10. The apparatus of claim 1, further comprising a plurality of electrically conductive vias disposed in the ground plane, the plurality of electrically conductive vias extending between the ground plane and an opposite ground plane disposed on an opposite side of the substrate from the ground plane, the plurality of electrically conductive vias arranged around a perimeter of the planar patch antenna element.

11. The apparatus of claim 1, wherein the elongate conductor forms a T-shape and is co-planar to the planar patch antenna element.

12. A system for wireless communications, the system comprising:
   a planar antenna array comprising a prime focus feed for a reflector antenna, the planar antenna array configured to illuminate the reflector antenna from a location at a primary focus of the reflector antenna, the planar antenna array further comprising,
   a substrate comprising a dielectric material;
   a plurality of planar antenna elements disposed on a surface of the substrate, the plurality of planar antenna elements comprising an electrically conductive material, wherein the plurality of planar antenna elements are arranged in an antenna array configured to produce a radiation pattern matched to the reflector antenna;
   a plurality of receive feed lines disposed on the surface of the substrate, each receive feed line in communication with one of the plurality of planar antenna elements;
   a plurality of transmit feed lines disposed on the surface of the substrate, each transmit feed line in communication with one of the plurality of planar antenna elements;

one or more closed slots in the electrically conductive material of the plurality of planar antenna elements, the one or more closed slots circumscribing each planar antenna element, each receive feed line, and transmit feed line, the one or more closed slots exposing the dielectric material of the substrate; and a ground plane disposed on the surface of the substrate, the ground plane comprising an electrically conductive material, the one or more closed slots disposed between the ground plane and the plurality of planar antenna elements;

wherein dimensions of the plurality of planar antenna elements are selected such that the planar antenna elements have a radiation efficiency of at least ninety percent.

13. The system of claim 12, further comprising the reflector antenna, wherein the reflector antenna is disposed opposite the plurality of planar antenna elements and the surface of the substrate, the plurality of planar antenna elements producing a radiation pattern matched to a focal length of the reflector antenna divided by a diameter of the reflector antenna.

14. The system of claim 13, wherein the reflector antenna and the planar antenna are arranged in one of an axis symmetric reflector geometry and an offset reflector geometry.

15. The system of claim 12, wherein the planar antenna array further comprises a plurality of electrically conductive vias disposed in the ground plane, the plurality of electrically conductive vias extending between the ground plane and an opposite ground plane disposed on an opposite side of the substrate from the ground plane, the plurality of electrically conductive vias arranged around a perimeter of each of the plurality of planar antenna elements.

16. The system of claim 12, further comprising one or more routing layers disposed on an opposite side of the substrate from the planar antenna elements, the one or more routing layers conducting electrical signals between the plurality of planar antenna elements and one or more electrical devices.

17. The system of claim 16, wherein the one or more electrical devices comprise one or more variable gain amplifiers and one or more phase shifters, the one or more variable gain amplifiers adjusting an amplitude of communications signals for the plurality of planar antenna elements and the one or more phase shifters adjusting a phase of the communications signals for the plurality of planar antenna elements, the one or more variable gain amplifiers and the one or more phase shifters electronically steering a communications beam for the plurality of planar antenna elements.

18. The system of claim 16, wherein the one or more electrical devices comprise one or more of a low noise amplifier, a block upconverter, a block downconverter, and a power amplifier.

19. The system of claim 12, wherein the plurality of planar antenna elements comprise one or more of a slot-type antenna element, a patch-type antenna element, a slot patch antenna element, and a dielectric resonator antenna element.

20. The system of claim 12, wherein the planar antenna array further comprises one or more capacitive couplings disposed between at least one of the plurality of planar antenna elements and at least one of the receive feed lines and the transmit feed lines, each of the one or more capacitive couplings comprising an elongate conductor forming a T-shape and being co-planar to the plurality of planar antenna elements.

21. The system of claim 12, wherein each of the plurality of planar antenna elements comprises:

a rectangular patch having a first side of a first length and a second side of a second length different than the first length, the second side being orthogonal to the first side, a receive feed point disposed on the first side and tuned to a first frequency corresponding to the first length, and a transmit feed point disposed on the second side and tuned to a second frequency corresponding to the second length and different than the first frequency, wherein the planar antenna element transmits and receives at different frequencies.

22. A method for forming an antenna for wireless communications, the method comprising:

forming a planar patch antenna element disposed on a surface of a substrate, the planar patch antenna element comprising an electrically conductive material in a rectangular shape with a first side having a first length and a second side having a second length different than the first length, the second side being orthogonal to the first side, the substrate comprising a dielectric material, forming a receive feed point of the planar patch antenna element, the receive feed point tuned to a first frequency corresponding to the first length, forming a transmit feed point of the planar patch antenna element, the transmit feed point tuned to a second frequency corresponding to the second length and different than the first frequency, wherein the planar patch antenna element transmits and receives at different frequencies;

forming a receive feed line disposed on the surface of the substrate, the receive feed line in communication with the planar patch antenna element;

forming a transmit feed line disposed on the surface of the substrate, the transmit feed line in communication with the planar patch antenna element;

forming a closed slot in the electrically conductive material of the planar patch antenna element, the closed slot circumscribing the planar patch antenna element, the receive feed line, and the transmit feed line, the closed slot exposing the dielectric material of the substrate;

forming a ground plane disposed on the surface of the substrate, the ground plane comprising an electrically conductive material, the closed slot disposed between the ground plane and the planar patch antenna element; and forming a capacitive coupling between the planar patch antenna element and a feed point for the planar patch antenna element, the feed point comprising one of the receive feed point and the transmit feed point, wherein the capacitive coupling comprises an elongate conductor disposed parallel to a side of the planar patch antenna element;

wherein dimensions of the planar patch antenna element and the closed slot are selected such that the planar antenna element and the closed slot have a radiation efficiency of at least ninety percent.

\* \* \* \* \*